United States Patent
Lee

(10) Patent No.: US 10,825,655 B1
(45) Date of Patent: Nov. 3, 2020

(54) SEPARATE PLASMA SOURCE COIL AND METHOD OF CONTROLLING THE SAME

(71) Applicant: Adaptive Plasma Technology Corp., Icheon-si (KR)

(72) Inventor: Sang Woo Lee, Suwon-si (KR)

(73) Assignee: ADAPTIVE PLASMA TECHNOLOGY CORP., Icheon-Si (KR)

( * ) Notice: Subject to any disclaimer, the term of this patent is extended or adjusted under 35 U.S.C. 154(b) by 0 days.

(21) Appl. No.: 16/712,061

(22) Filed: Dec. 12, 2019

(30) Foreign Application Priority Data

Jul. 18, 2019 (KR) .................. 10-2019-0087165

(51) Int. Cl.
*H01J 37/32* (2006.01)
*H01L 21/306* (2006.01)
*H01L 21/67* (2006.01)

(52) U.S. Cl.
CPC ..... *H01J 37/3211* (2013.01); *H01J 37/32935* (2013.01); *H01L 21/67069* (2013.01); *H01J 2237/20207* (2013.01); *H01J 2237/20235* (2013.01); *H01J 2237/24514* (2013.01); *H01J 2237/3344* (2013.01)

(58) Field of Classification Search
CPC ...... H01J 37/32; H01J 37/321; H01J 37/3211; H01J 37/32174; H01J 37/32165; H01J 37/32935; H01L 21/306; H01L 21/3065
See application file for complete search history.

(56) References Cited

U.S. PATENT DOCUMENTS

| | | | | |
|---|---|---|---|---|
| 6,073,384 A * | 6/2000 | Schlaegel | ............... | A01K 83/06 43/42.08 |
| 6,077,384 A * | 6/2000 | Collins | ................... | A21D 2/185 118/723 I |
| 6,165,311 A * | 12/2000 | Collins | .................. | B01D 53/22 156/345.26 |
| 6,217,718 B1* | 4/2001 | Holmann | ................ | C23C 14/32 118/723 I |
| 6,308,654 B1* | 10/2001 | Schneider | ............. | H01J 37/321 118/723 I |
| 2002/0041160 A1* | 4/2002 | Barnes | ............... | H01J 37/32174 315/111.21 |
| 2005/0001556 A1* | 1/2005 | Hoffman | ........... | H01J 37/32623 315/111.91 |
| 2007/0256787 A1* | 11/2007 | Chandrachood | ...... | H01J 37/321 156/345.48 |
| 2008/0017317 A1* | 1/2008 | Jeon | ......................... | H05H 1/46 156/345.38 |
| 2008/0223521 A1* | 9/2008 | Kim | ...................... | H01J 37/321 156/345.1 |

(Continued)

FOREIGN PATENT DOCUMENTS

KR 100519677 10/2005
KR 20100048079 5/2010

(Continued)

*Primary Examiner* — Thai Pham
(74) *Attorney, Agent, or Firm* — Cantor Colburn LLP

(57) ABSTRACT

Provided is a separate plasma source coil and a method of controlling the same. The separate plasma source coil includes a center coil group disposed around a coil center and including one or more linear center coils, and an edge coil group disposed around the center coil group and including one or more linear edge coils.

5 Claims, 3 Drawing Sheets

(56) References Cited

U.S. PATENT DOCUMENTS

| | | | | |
|---|---|---|---|---|
| 2010/0243162 A1* | 9/2010 | Koshimizu | ........... | H01J 37/321 |
| | | | | 156/345.28 |
| 2011/0133650 A1* | 6/2011 | Kim | ................. | H01J 37/32577 |
| | | | | 315/111.21 |
| 2013/0105086 A1* | 5/2013 | Banna | ...................... | H05H 1/46 |
| | | | | 156/345.38 |
| 2013/0256271 A1* | 10/2013 | Panagopoulos | ....... | H01J 37/321 |
| | | | | 216/68 |

FOREIGN PATENT DOCUMENTS

| | | |
|---|---|---|
| KR | 20130019712 | 2/2013 |
| KR | 20130043795 | 5/2013 |
| KR | 20130070545 | 6/2013 |
| WO | 2013062929 | 5/2013 |
| WO | 2017189234 | 11/2017 |

\* cited by examiner

SEPARATE PLASMA SOURCE COIL AND METHOD OF CONTROLLING THE SAME

TECHNICAL FIELD

The present invention relates to separate a plasma source coil and a method of controlling the same, and particularly, to separate a plasma source coil including a center coil group and an edge coil group which are separated from each other, and a method of controlling the same.

BACKGROUND ART

There is a gradually increasing need for ensuring uniformity in results of semiconductor processes as the semiconductor processes become finer and advanced. In order to ensure uniformity of the overall multiple semiconductor processes, it is necessary to avoid errors during the respective processes. For example, it is necessary to make a uniform distribution of plasma density in a chamber which affects uniformity of an etching rate or uniformity of a critical line width during an etching process. The plasma density in the chamber may depend on various parameters. For example, a plasma source coil is considered as a factor that affects the distribution of the plasma density. Therefore, the plasma source coil needs to be structured to form a uniform distribution of plasma density in a chamber, and the plasma source coil advantageously has a structure capable of removing the cause of errors. Korean Patent No. 10-0519677 discloses a method of manufacturing a plasma coil which has high reliability and is suitable for mass-production. WO 2013/062929 discloses a plasma processing apparatus that effectively controls non-uniformity of plasma processing. Further, WO 2017/189234 discloses a VHF Z-coil plasma source that may provide high density plasma ions, thereby improving semiconductor processing performance and productivity. In order to ensure uniformity of plasma generated from the plasma source coil, it is preferentially necessary to make the plasma source coil structurally stable. Furthermore, when there is, for example, a deviation in respect to a tilting or height, it is necessary to provide a means capable of effectively coping with the tilting or the height deviation. However, the related arts do not disclose the above-mentioned structure or means.

SUMMARY OF THE INVENTION

An object of the present invention is to provide a separate plasma source coil which is separately disposed in at least two regions such that tiltings or heights of the plasma source coil may be adjusted, and a method of controlling the plasma source coil.

An exemplary embodiment of the present invention provides a separate plasma source coil including a center coil group disposed around a coil center and comprising one or more linear center coils, and an edge coil group disposed around the center coil group and comprising one or more linear edge coils.

According to the exemplary embodiment of the present invention, the one or more linear center coils or the one or more linear edge coils may extend in a spiral shape.

According to the exemplary embodiment of the present invention, a circumferential angle at which the one or more linear center coils or the one or more linear edge coils extend in the spiral shape may be 270 degrees or more.

According to the exemplary embodiment of the present invention, tiltings or heights of the center coil group and the edge coil group may be simultaneously or independently adjustable.

According to the exemplary embodiment of the present invention, the separate plasma source coil may include one or more adjustment means configured to adjust the height or the tilting of the center coil group or the edge coil group.

Another exemplary embodiment of the present invention provides a method of controlling a plasma source coil, the method including disposing first and second coil groups each having multiple coils on one plane, detecting, with respect to a reference plane, density of plasma generated by the first and second coil groups, and adjusting a tilting or a height of the first or second coil group.

According to the exemplary embodiment of the present invention, the first and second coil groups may be independently adjustable.

The separate plasma source coil according to the present invention may be divided into the center coils and the edge coils which are disposed in parallel on one plane, such that the center coils and the edge coils may be independently controlled. With this structure, it is possible to easily control the generation of the plasma and easily ensure the uniformity of the density of the plasma. According to the separate plasma source coil according to the present invention, the tiltings or the heights of the center coils and the edge coils are independently or simultaneously adjusted, such that it is possible to precisely correct errors in order to ensure uniformity. In addition, the method of controlling the plasma source coil according to the present invention may flexibly and precisely control the generation of plasma while coping with the situation in which the line width becomes finer or advanced.

DETAILED DESCRIPTION

Figure 1:
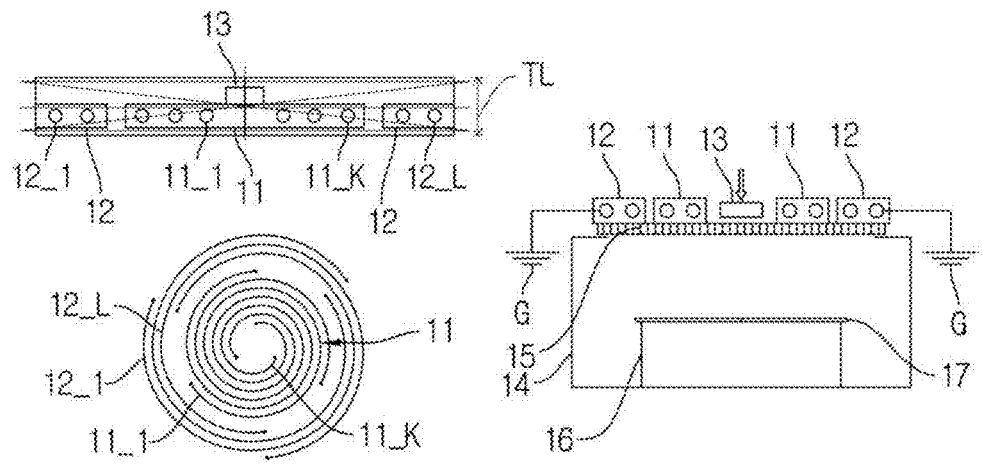
FIG. 1 is a view illustrating an exemplary embodiment of a separate plasma source coil according to the present invention.

The present invention will be described in detail below with reference to the exemplary embodiments illustrated in the accompanying drawings, but the exemplary embodiments are provided for clearly understanding the present invention, and the present invention is not limited to the exemplary embodiments. In the following description, the constituent elements illustrated in the different drawings but denoted by the identical reference numerals have similar functions, and the constituent elements will not be repeatedly described unless the description is required to understand the invention. The description of the publicly known constituent elements is simply made or omitted, but it should not be understood that the publicly known constituent elements are excluded from the exemplary embodiments of the present invention.

FIG. 1 is a view illustrating an exemplary embodiment of a separate plasma source coil according to the present invention.

Referring to FIG. 1, the separate plasma source coil includes a center coil group 11 disposed around a coil center 13 and including one or more linear center coils 11_1 to 11_K, and an edge coil group 12 disposed at a circumferential side of the center coil group 11 and including one or more linear edge coils 12_1 to 12_L.

The plasma source coil may be a coil installed in a plasma source that generates plasma by being supplied with RF power. For example, the plasma source may have, but not limited to, transformer coupled plasma (TCP), inductively coupled plasma (ICP), or helicon plasma (HP). Further, the plasma source may supply the plasma to various semiconductor processes such as an etching process, and the present invention is not limited to the purpose of the plasma. The center coil group 11 and the edge coil group 12 may include the one or more linear center coils 11_1 to 11_K and the one or more linear edge coils 12_1 to 12_L, respectively. Each of the coil groups 11 and 12 may have a planar structure as a whole, and the center coil group 11 and the edge coil group 12 may be disposed on a single plane. The linear center coils 11_1 to 11_K and the linear edge coils 12_1 to 12_L, which constitute the coil groups 11 and 12, respectively, each may have a linearly extending structure. For example, the respective coils 11_1 to 12_L may be structured to be extended in spiral shapes along circumferences having different diameters. Further, the different coils 11_1 to 12_L may be disposed on the same plane. The center coil group 11 and the edge coil group 12 may be disposed in central and circumferential regions of a circular region, respectively. The respective coils 11_1 to 12_L may be separately disposed. The respective coils 11_1 to 12_L may have a circular cross section, a quadrangular cross section, a polygonal cross section, or a cross section similar thereto. Further, the respective coils 11_1 to 12_L may extend in the spiral shapes along the circumferences having the different diameters. For example, the extension length may correspond to a circumferential angle of 270 degrees or more. In particular, the extension length may be, but not limited to, 270 degrees to 720 degrees, and more particularly, 320 degrees to 420 degrees. A separation region may be formed between the center coil group 11 and the edge coil group 12, and the separation region may be equal to or larger than a separation interval between the linear center coils 11_1 to 11_K or between the linear edge coils 12_1 to 12_L. For example, the separation interval between the groups 11 and 12 may be, but not limited to, 1.0 to 10.0 times the separation interval between the coils 11_1 to 11_K or between the coils 12_1 to 12_K.

The center coil group 11 and the edge coil group 12 may be independently moved vertically or independently adjusted in tilting. For example, each of the center coil group 11 and the edge coil group 12 may have a vertical displacement TL of 1 to 20 mm vertically or the tilting of each of the center coil group 11 and the edge coil group 12 may be changed so that an outer circumference of the edge coil group 12 reaches the vertical displacement TL based on the coil part 13. The linear center coils 11_1 to 11_K and the linear edge coils 12_1 to 12_L may be independently moved vertically or independently adjusted in tilting. The center coil group 11 and the edge coil group 12 may be selectively moved vertically together or selectively adjusted in tilting. The region in which the center coil group 11 is disposed may be 0.5 to 2.0 times the region in which the edge coil group 12 is disposed, but the present invention is not limited thereto. The center coil group 11 may be selectively configured as at least one sub center coil group including the one or more linear center coils 11_1 to 11_K, or the edge coil group 12 may be selectively configured as at least one sub edge coil group 12 including the one or more linear edge coils 12_1 to 12_L. The center coil group 11 or the edge coil group 12 may have various structures, and the center coil group 11 or the edge coil group 12 is not limited to the provided exemplary embodiment.

The plasma is generated by the plasma source coil and may be guided into a process chamber 14. A lower electrode 16 such as a cathode may be disposed in the process chamber 14, and an electrostatic chuck 17 to which a wafer is fixed may be installed at an upper side of the lower electrode 16. The plasma source coil may be disposed at an upper side of a sealing means 15 such as a dome made of an insulating material, and the coil center 13 may be disposed to be coincident with a center of the electrostatic chuck 17. When a plasma generation gas is injected into the process chamber 14 and RF power is applied through the coil center 13, the plasma may be induced between the plasma source coil and the lower electrode 13. The plasma, which is generated by the center coil group 11 and the edge coil group 12, needs to have uniform density based on a process plane of a wafer, and the uniform density of the plasma may ensure uniformity in processing the wafer. The density of the plasma on the surface of the wafer fixed at an upper side of the electrostatic chuck 17 may be detected. As necessary, the height or the tilting of the center coil group 11 or the edge coil group 12 may be adjusted. Reference numeral G in FIG. 1 indicates earth connection.

Figure 2:
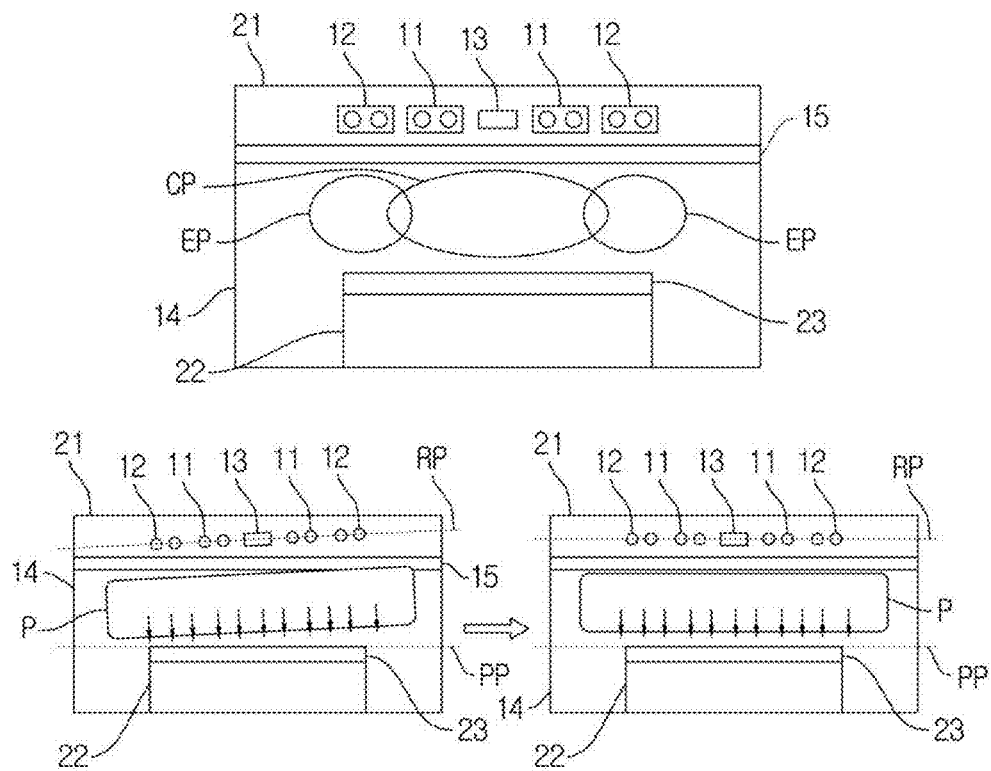
FIG. 2 is a view illustrating an exemplary embodiment of a process of controlling generation of plasma by the plasma source coil according to the present invention.

FIG. 2 is a view illustrating an exemplary embodiment of a process of controlling generation of plasma by the plasma source coil according to the present invention.

Referring to FIG. 2, a substrate 23 such as a wafer may be fixed in the process chamber 14 by a substrate fixing means 22, and the sealing means 15 such as a dome may be disposed at an upper side of the process chamber 14. The plasma may be generated in the process chamber 14 by a method similar to the above-mentioned method. The plasma source coil may include the center coil group 11 and the edge coil group 12. The center coil group 11 and the edge coil group 12 may be disposed in an arrangement block 21 made of an insulating material. An adjustment means configured to adjust the heights or the tiltings of the center coil group 11 and the edge coil group 12 may be disposed in the arrangement block 21. Center plasma CP and edge plasma EP are generated above the substrate 23 by the center coil group 11 and the edge coil group 12, and a process such as an etching process may be performed on the substrate 23 such as, for example, a wafer.

As illustrated in the lower part in FIG. 2, plasma P, which is generated based on a process reference plane PP formed above the substrate 23, needs to have uniform density in a horizontal direction. If it is detected that the plasma P is not uniformly distributed, the generation shape of the plasma P needs to be adjusted, as illustrated in the right lower part in FIG. 2. The center coil group 11 and the edge coil group 12 may be disposed on the same plane, and a coil reference plane RP may be set which connects the center coil group 11 and the edge coil group 12. The heights or the tiltings of the center coil group 11 and the edge coil group 12 may be adjusted by adjusting the height or the tilting of the coil reference plane RP based on the process reference plane PP. Further, a generated state of the plasma generated in the process chamber 14 may be controlled by adjusting the height or the tilting of the center coil group 11 or the edge coil group 12.

Figure 3:
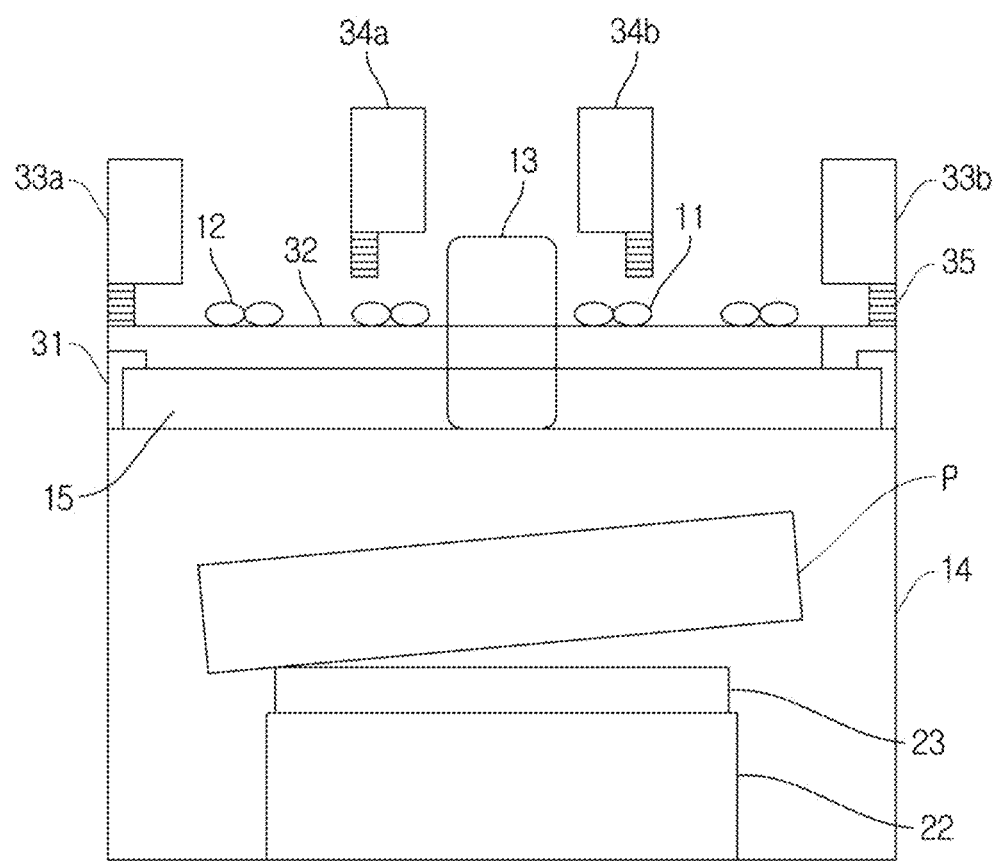
FIG. 3 is a view illustrating an exemplary embodiment of a structure capable of adjusting tiltings or heights of the plasma source coils according to the present invention.

FIG. 3 is a view illustrating an exemplary embodiment of a structure capable of adjusting tiltings or heights of the plasma source coil according to the present invention.

Referring to FIG. 3, one or more adjustment means 33a, 33b, 34a, and 34b are provided which are configured to adjust the height or the tilting of the center coil group 11 or the edge coil group 12. If the density of the plasma P, which is generated based on the substrate 23 fixed to the substrate fixing means 22, is not uniformly distributed, the heights or the tiltings of the plasma source coil may be adjusted by the adjustment means 33a, 33b, 34a, and 34b. The sealing means 15 such as a dome may seal the upper side of the process chamber 14 by a locking means 31 such as a lock. The plasma source coil including the center coil group 11 and the edge coil group 12 may be fixed to a coil fixing block 32 made of, for example, polyether ether ketone, acrylonitrile butadiene styrene, polycarbonate, or similar insulating synthetic resin having high strength. The coil fixing block 32 may include at least two separable sub fixing blocks to which the center coil group 11 and the edge coil group 12 are fixed, and the heights or the tiltings of the respective sub fixing blocks may be adjusted by the adjustment means 33a, 33b, 34a, and 34b. The heights or the tiltings of the respective sub fixing blocks may be adjusted by displacement adjusting means 35 connected to the adjustment means 33a, 33b, 34a, and 34b such as, for example, motors. Various means, such as, for example, a bellows of which the length may be adjusted by an operation of a motor, may be adopted as the displacement adjusting means 35. The displacement adjusting means 35 may be coupled to the coil fixing block 32 and may adjust the displacement of the center coil group 11 or the edge coil group 12. The one or more adjustment means 33a, 33b, 34a, and 34b may be coupled to the center coil group 11 and the edge coil group 12, respectively, by means of the displacement adjusting means 35. Further, if the density of the plasma P, which is generated based on the substrate 23, is not uniformly distributed, the displacement of the center coil group 11 or the edge coil group 12 may be adjusted.

Figure 4:
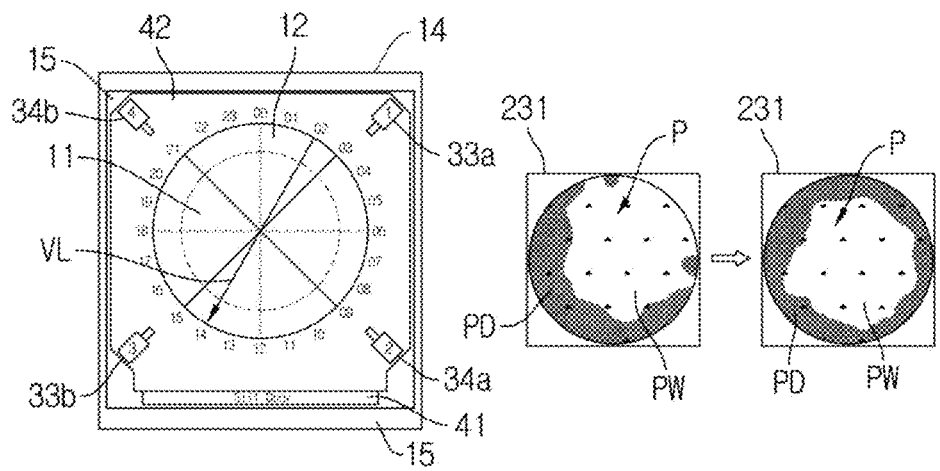
FIG. 4 is a view illustrating an exemplary embodiment of a method of controlling the plasma source coil according to the present invention.

FIG. 4 is a view illustrating an exemplary embodiment of a method of controlling the plasma source coils according to the present invention.

Referring to FIG. 4, the method of controlling the plasma source coil includes disposing the first and second coil groups each having the multiple coils on one plane; detecting, with respect to the reference plane, the density of the plasma generated by the first and second coil groups; and adjusting a tilting or a height of the first or second coil group.

As described above, the plasma source coil entirely defines a circular plate shape and may include the center coil group 11 corresponding to a first coil group, and the edge coil group 12 corresponding to a second coil group. The first coil group and the second coil group may include the multiple coils extending in a spiral shape. The plasma source coil may be disposed based on the center of the substrate. The plasma source coil may be disposed above the process chamber 14 based on the substrate. When the substrate such as a wafer is loaded into the process chamber 14 through a slit door 41 and then fixed in the process chamber 14, the interior of the process chamber 14 may be formed in a vacuum state. Thereafter, when the plasma is generated in the process chamber 14 by the plasma source coil, the density of the plasma P may be detected with respect to the substrate. As illustrated in the middle part in FIG. 4, when the density of the plasma P is divided into a high density region PD and a low density region PW based on the substrate, the heights or the tiltings of the plasma source coil need to be adjusted.

The plasma source coil may be fixed to the coil fixing block as described above, and the coil fixing block may be coupled to an adjustment block 42 of which the tilting or the height is adjusted by the adjustment means 33a, 33b, 34a, and 34b. An adjustment reference plane 231 corresponding to the adjustment block 42 may be formed along a circumferential side of the substrate, and the height adjustment means 33a, 33b, 34a, and 34b may be disposed around the adjustment block 42. The adjustment reference plane 231 and the adjustment block 42 each have a square structure, and the adjustment means 33a, 33b, 34a, and 34b may be disposed at four corners of the adjustment block 42. For example, the first and second adjustment means 33a and 33b for adjusting the center coil group 11 may be disposed to face each other, and the third and fourth adjustment means 34a and 34b for adjusting the edge coil group 12 may be disposed to face each other. The tilting and the height may be adjusted in accordance with the distribution of the density of the plasma P with respect to the substrate and based on multiple imaginary adjustment lines VL formed based on the center of the plasma source coil. Each of the imaginary adjustment lines VL may be a diameter line passing through the center of the plasma source coil. The multiple imaginary adjustment lines VL may be formed so that the adjacent imaginary adjustment lines VL have the same center angle. For example, the number of imaginary adjustment lines VL may be 12 to 48. The tilting or the height may be adjusted based on the imaginary adjustment lines VL and in accordance with the distribution of the density of the plasma P. Various numbers of adjustment means 33a, 33b, 34a, and 34b may be disposed at various positions on the adjustment block 42, and the present invention is not limited to the provided exemplary embodiment.

Figure 5:
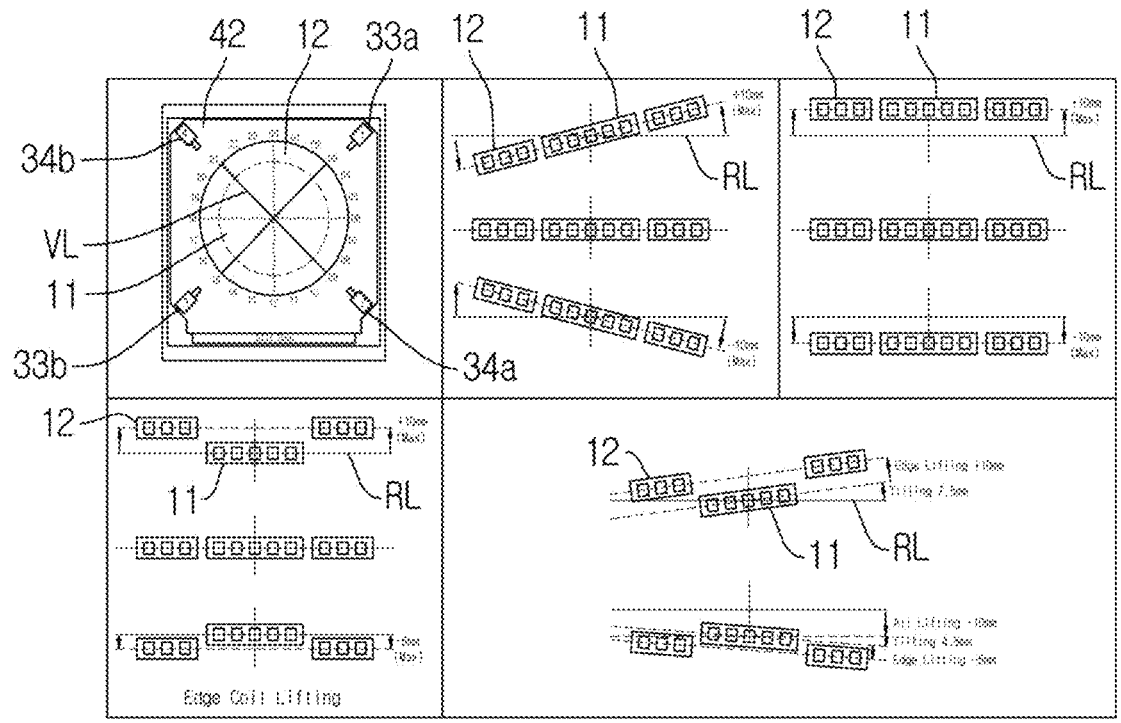
FIG. 5 is a view illustrating various exemplary embodiments in which heights or tiltings of the plasma source coils are adjusted by the method of controlling the plasma source coil according to the present invention.

FIG. 5 is a view illustrating various exemplary embodiments in which heights or tiltings of the plasma source coil are adjusted by the method of controlling the plasma source coil according to the present invention.

Referring to FIG. 5, the tilting of one of the multiple imaginary adjustment lines VL may be adjusted with respect to the coil reference line RL. In addition, the height of the center coil group 11 and the height of the edge coil group 12 may be adjusted together or independently with respect to the coil reference line RL. Alternatively, the tilting of the center coil group 11 or the tilting of the edge coil group 12 may be adjusted after the height of the edge coil group 12 is adjusted or after the height of the edge coil group 12 is adjusted. The adjustment block 42 may have coupled portions connected to the center coil group 11 and the edge coil group 12, and the heights or the tiltings of the respective coupled portions may be adjusted by the operations of the adjustment means 33a, 33b, 34a, and 34b. For example, each of the adjustment means 33a, 33b, 34a, and 34b may be configured as a component such as a motor, and the tilting or the height of the adjustment block 42 may be adjust as the motor rotates forward or reversely. The tiltings or the heights of the plasma source coil may be adjusted in accordance with the distribution of the density of the plasma in the process chamber so that the tiltings or the heights of the plasma source coil are suitable for the distribution of the density of the plasma. The displacements of the plasma source coil may be adjusted by various methods, and the present invention is not limited to the provided exemplary embodiment.

The separate plasma source coil according to the present invention may be divided into the center coils and the edge coils which are disposed in parallel on one plane, such that the center coils and the edge coils may be independently controlled. With this structure, it is possible to easily control the generation of the plasma and easily ensure the uniformity of the density of the plasma. According to the separate plasma source coil according to the present invention, the tiltings or the heights of the center coils and the edge coils are independently or simultaneously adjusted, such that it is possible to precisely correct errors in order to ensure uniformity. In addition, the method of controlling the plasma source coil according to the present invention may flexibly and precisely control the generation of plasma while coping with the situation in which the line width becomes finer or advanced.

While the present invention has been described in detail above with reference to the provided exemplary embodiments, various modifications and alterations may be made by those skilled in the art referring to the provided exemplary embodiments without departing from the technical spirit of the present invention. The present invention is not limited by the modifications and alterations but defined by the appended claims.

What is claimed is:

1. A separate plasma source coil comprising:
    a center coil group disposed around a coil center and comprising two or more linear center coils, the two or more linear center coils being disposed on a first single plane, each of the two or more linear center coils extending in a spiral shape; and
    an edge coil group disposed around the center coil group and comprising two or more linear edge coils, the two or more linear edge coils being disposed on a second single plane, each of the two or more linear edge coils extending in a spiral shape,
    wherein tiltings or heights of the center coil group and the edge coil group are configured to be simultaneously or independently adjustable.

2. The separate plasma source coil of claim 1, wherein a circumferential angle at which the two or more linear center coils or the two or more linear edge coils extend in the spiral shape is 270 degrees or more.

3. The separate plasma source coil of claim 1, further comprising:
    one or more adjustment means configured to adjust height or tilting of the center coil group or the edge coil group.

4. A method of controlling a plasma source coil, the method comprising:
    disposing first and second coil groups each having multiple coils and being disposed on a single plane, respectively, each of the multiple coils extending in a spiral shape;
    detecting, with respect to a reference plane, density of plasma generated by the first and second coil groups; and
    adjusting a tilting or a height of the first or second coil group.

5. The method of claim 4, wherein the first and second coil groups are independently adjustable.

* * * * *